United States Patent

Perrin et al.

[11] Patent Number: 6,078,117
[45] Date of Patent: Jun. 20, 2000

[54] END CAP ASSEMBLY AND ELECTRICAL MOTOR UTILIZING SAME

[75] Inventors: Randall L. Perrin; John M. Washeleski, both of Cadillac; Peter H. Strom, Big Rapids, all of Mich.

[73] Assignee: Nartron Corporation, Reed City, Mich.

[21] Appl. No.: 09/235,683

[22] Filed: Jan. 22, 1999

Related U.S. Application Data

[63] Continuation-in-part of application No. 08/918,918, Aug. 27, 1997.

[51] Int. Cl.⁷ .................................................. H02K 11/00
[52] U.S. Cl. .......................... 310/68 R; 310/51; 310/220; 310/239
[58] Field of Search ..................... 310/68 R, 51, 310/220, 221, 239; 333/181, 182

[56] References Cited

U.S. PATENT DOCUMENTS

| | | | |
|---|---|---|---|
| 2,393,045 | 1/1946 | Hotchner | 172/278 |
| 3,924,147 | 12/1975 | Tarnow et al. | 310/239 |
| 4,329,605 | 5/1982 | Angi et al. | 310/68 R |
| 4,384,223 | 5/1983 | Zelt | 310/68 R |
| 4,384,331 | 5/1983 | Fukuhara et al. | |
| 4,429,241 | 1/1984 | Ohara et al. | 310/51 |
| 4,462,012 | 7/1984 | Kerber et al. | |
| 4,550,268 | 10/1985 | Becker et al. | 310/239 |
| 4,673,837 | 6/1987 | Gingerich et al. | 310/239 |
| 4,698,605 | 10/1987 | Imamura et al. | |
| 4,800,348 | 1/1989 | Rosar et al. | |
| 4,896,067 | 1/1990 | Walther | 310/239 |
| 4,992,060 | 2/1991 | Meyer | |
| 5,231,321 | 7/1993 | Takiguchi | 310/51 |
| 5,236,376 | 8/1993 | Cohen | |
| 5,306,974 | 4/1994 | Bates | 310/68 R |
| 5,500,629 | 3/1996 | Meyer | |
| 5,610,467 | 3/1997 | Shiah et al. | 310/239 |
| 5,717,270 | 2/1998 | Lau et al. | 310/220 |
| 5,770,902 | 6/1998 | Batten et al. | 310/68 R |
| 5,943,214 | 8/1999 | Sato et al. | 361/752 |
| 5,966,684 | 10/1999 | Richardson et al. | 702/191 |

FOREIGN PATENT DOCUMENTS

| | | |
|---|---|---|
| 2602920 | 2/1988 | France . |
| 407107709A | 4/1995 | Japan . |
| 7603783 | 11/1976 | Niger . |

*Primary Examiner*—Nestor Ramirez
*Assistant Examiner*—Tran N Nguyen
*Attorney, Agent, or Firm*—Brooks & Kushman P.C.

[57] ABSTRACT

An end cap assembly is configured as an electronic conducted noise filter and/or radiated field shield for incorporation as the end cap of a motor housing case as original equipment. The assembly includes a conductive panel having conductive members which interconnect discrete electrical components of a filter network array. Alternatively, various types of printed circuit boards, wireframe assemblies, wirewrap assemblies, and lead frame assemblies may be used. These assemblies include the conductive members which are held in position within an electrically insulative component member or housing of the end cap assembly by such means as insertion of tabs into captivating slots, insert overmolding, encapsulation, heat staking, mechanical, fasteners, and/or adhesives.

10 Claims, 6 Drawing Sheets

END CAP ASSEMBLY AND ELECTRICAL MOTOR UTILIZING SAME

CROSS-REFERENCE TO RELATED APPLICATION

This application is a continuation-in-part application to the U.S. patent application entitled "In-Line Module For Attenuating Electrical Noise" filed on Aug. 27, 1997 and having application Ser. No. 08/918,918.

TECHNICAL FIELD

This invention relates to end cap assemblies for attenuating electrical noise and electrical motors utilizing same. In particular, the present invention relates to end cap assemblies for attenuating electrical noise and electrical motors utilizing same wherein the end cap assembly is configured as an electronic conducted noise filter and/or radiated field shield for incorporation within the end cap of the motor housing case as original equipment.

BACKGROUND ART

With ever increasing applications and utilization of electrical and electronic control systems composed of sensors, control electronics, and actuators, there are concurrent and ever increasing technical difficulties pertaining to reliable implementation thereof. Additionally, urgency in rushing product development to facilitate getting devices to market, ongoing incremental technical developments, and desires to include upgraded functional features increasingly cause product obsolescence prior to end of life failure.

Numerous new sensors are constantly being developed, many of which push the limits of physical properties and principles. Some sensors transduce very small changes in physical signals with high resolution and accuracy into low voltage, low current, high impedance analog electrical signals. Modern control system electronics typically tend toward various features including: higher clock frequencies; higher switching slew rates; lower voltages; lower and higher currents; widely distributed controls; direct digital control of power electronics; wider environmental operating conditions; and wire harnesses containing mixed conductor types of analog, digital, and power conductors.

Improvements in modern electronic control systems, power electronic components, and high power electrical actuators now enable sophisticated control of electrical transducing actuators to perform tasks previously practical only by other non-electrical methods. High power actuators, now in typical use, require high levels of voltage and/or current. One result of these technological advancements in sensing, electronics, and actuators is numerous new opportunities for electrical noise caused by various transients and frequencies of voltages and currents of a system to interfere with another system or even with itself. Witness the numerous standards issued by major technical societies and industrial nations pertaining to allowable levels of wideband radio frequency interference (RFI) emissions and susceptibility via conduction and field transmission. An additional result is obsolescence (sometimes planned) of existing electrical and electronic devices by new, improved devices offering additional features.

Interference noise from zero Hz through RF is transmitted via four major methods consisting of: Electric field (e-field), magnetic field (m-field), electromagnetic (EM) field, and conducted. The fields are transmitted via contactless transmission.

The space surrounding a source of radiation can be broken into two regions, near or induction field and far or radiation field. Near field is usually defined as the distance closer than the wavelength divided by $2\pi$. Far field is greater than this distance. The ratio of E field to H field is the wave impedance. In the far field the E/H ratio equals the characteristic impedance of the medium. (377 ohm for free space). In the near field, the ratio is determined by the characteristics of the source and the distance from the source to where the field is observed. If the source has high current and low voltage (E/H<377), the near field is predominantly magnetic, high voltage low current is E/H>377, the near field is predominantly electric. Usually when individual electric and magnetic field are discussed, they are assumed to be in the near field. Also in the near field region, fields are strongly dependent on distance since the predominant of H and E field fall of as $1/D^3$ and the lesser of H and E field fall off as $1/D^2$ so that the characteristic wave impedance approaches that of the medium as it leaves the source and asymptotically becomes that of the medium at far field distances beyond $\lambda/2\pi$.

Conducted transmission is essentially electrical energy passing via direct electrical connection. High voltages produce strong e-fields. High currents produce strong m-fields. High voltages and/or high electrical currents oscillating at high frequencies or high acceleration of charges produce strong EM fields. EM fields from the very low frequency (long wavelengths on scale of kilometers and longer) to extremely high frequency (short wavelengths on scale of molecules and shorter) are generally composed of orthogonal coupled e-fields with m-fields which emanate at the speed of radio waves in that medium and which may also have such characteristics as being polarized, rotating, coherent, or incoherent. EM antenna characteristics of a device at a given frequency relate to geometry, conductivity, and dielectric coupling with its environment. A device which is a good field emitting or transmitting antenna with high emissivity characteristics is generally also a good field receiving antenna with associated high susceptibility characteristics.

Undesired interference is called noise. Not all interference is man-made. Natural phenomena which produce high (RF) and/or low frequency interference include: solar wind (atmospheric ionization), electrical storms (lightning), static electricity discharge (sparks), geomagnetic storms (ground currents), and more. Many sources of interference are man-made devices operating as designed and in other cases, not operating as intended. Newer electronic devices and systems tend to be more sensitive and thus can be more affected by various natural and man-made sources of interference. It is possible that devices engineered and manufactured to older specifications can produce interference which is not readily apparent to the casual observer but which can have catastrophic effect upon susceptible devices.

Electromagnetic compatibility (EMC) is here understood to relate to components, devices, and systems compatible with respect to noise transmitted and/or received via conduction and/or field transmission, especially in the RF spectrum. Typical specifications relate quantities and durations of anomalous system operation allowed versus quantity of interference of various types, examples of which a system output may have are: no effect, temporary effect on performance or accuracy, permanent effect on performance or accuracy, and functional death of the system. Critical safety related applications mandate a very high reliability and tolerance to all types of interference and environmental conditions. Modern application customers expect and demand reliable operation from all components and systems under all anticipated operating conditions. The need increasingly exists for systems and component devices to reduce both interference emitted and susceptibility to external noise emissions received.

One significant source of electrical noise is motors for which currents and voltages are switched or commutated. This includes direct current (DC) motors and also some types of alternating current (AC) motors such as AC commutator motors, universal motors, and motors for which the alternating currents are generated by switching inverter circuits. Motors can be particularly noisy under certain transient conditions, for example, high startup current, and overspeed of an under-loaded series DC motor. For many of the existing motor designs in production and common use, it is desired simply to attenuate the RFI noise which they produce to maintain compliance with newer EMC regulations. It is common knowledge that various types of motor operation emit noise that can be detected by radio or television receivers.

Modern motor applications can include electrical analog and digital signal-carrying wires to and from the motor along with the power supply wires.

These signals are typically used with closed loop feedback control and safety systems for monitoring and control of such motor parameters as position (rotary or linear), velocity, acceleration, stator and armature resolver and encoder voltage waveforms, stator and armature current and voltage waveforms, rotor torque (also the linear motor analog of force), stator and armature temperatures, and the like.

In various applications, signal processing circuitry (analog and/or digital) is incorporated: (1) within the motor housing; (2) attached to the motor, near but separate from the motor; or (3) remote from the motor. This control circuitry and thus the system functional operation can potentially be detrimentally affected by noise generated within the motor itself and/or by outside sources and transmitted by: motor wiring, magnetic fields, electric fields, or via EM fields. New demand and consideration are being given for use of multiple critical and sensitive low-level and/or high speed analog and/or digital motor sensing and control circuits which are potentially sensitive to RFI conduction, emissivity and susceptibility.

U.S. Pat. No. 4,698,605 discloses an electronic filter component for attenuation of high frequency conducted electrical current noise of a single conductor (and thus its associated radiated noise), being comprised simply of a cylinder of semiconductor ferrite having also some capacitive properties imparted by virtue of metallizing the outer circumference and optionally the inner bore such that with or without ohmic contact of the conductor with the inner metallized bore the component will have properties of distributed inductance and capacitance to perform in the functional capacity as a low pass common mode electronic current filter.

U.S. Pat. No. 4,992,060 discloses an electronic filter device having a standard ferrite component with no metallization. Inner metallization is functionally supplied by a metal shield around the wire bundle. Outer metallization is functionally supplied and held proximal by the inside of the connector shell, shaped to be captive and protected within the connector housing, and optionally being axially split to fit within the two halves of the connector. The component is integral within at least one end of a shielded cable connector for attenuation of high frequency conducted electrical current noise primarily of the shield of a shielded conductor bundle (and thus its associated radiated noise) such that the ferrite with metal contact on its inner and outer cylindrical surfaces also has some capacitive properties imparted by virtue of the metallic contact with the outer circumference and the inner bore will have properties of distributed inductance and capacitance to perform in the functional capacity as a low pass common mode electronic current filter.

U.S. Pat. No. 5,500,629 discloses an electronic filter component for attenuation of high frequency conducted electrical current noise (and thus its associated radiated noise) of a single conductor (and/or with multiple use for multiple conductors), being comprised simply of a sandwich-like shape of special types of engineered non-linear ferrite having inductive, resistive, and capacitive properties in bulk and also some capacitive properties imparted by virtue of metallizing electrical contact areas such that the component will have properties of transient clipping with distributed inductance and capacitance to perform in the functional capacity as a low pass common mode electronic current filter.

U.S. Pat. No. 4,800,348 discloses an adjustable electronic filter including dielectric block having one or more through holes.

For applications using both existing and new motors, an emerging need exists for reliable methods to control noise, especially RFI noise, both where generated and where received.

Significant opportunity lies not only in new replacement devices meeting updated electrical-related interference noise specifications but also in modular in-line retrofit and/or optional modular in-line device additions to existing and even new systems rendering improved interface and/or optional functional capabilities.

Figure 1:
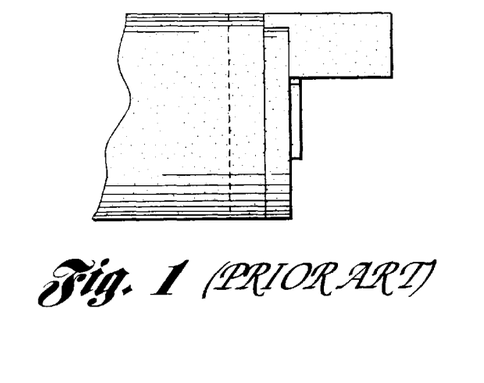
FIG. 1 is a side elevational view, partially broken away, of a prior art small electrical motor.
Figure 2:
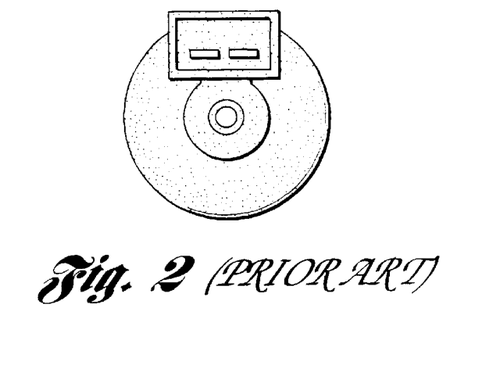
FIG. 2 is an end view of the motor of FIG. 1.

FIGS. 1 and 2 show respective partial radial and termination-end axial views of a typical small motor not incorporating integral electrical noise filtration methods. High volume and low cost production motor end caps are typically composed primarily of plastic with some metallic components, although some motor designs have a nearly complete exterior of metal. A typical motor end cap contains a DC commutator brush assembly.

Figure 3:
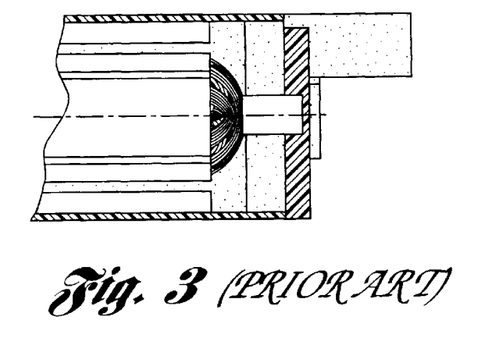
FIG. 3 is a side elevational view, partially broken away, of a prior art electrical motor with a connector.
Figure 4:
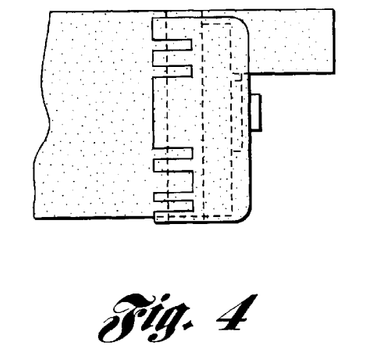
FIG. 4 is a side elevational view, partially broken away, of a small motor terminal end cap incorporating a revised retainer which grips the motor case on its outside. This retainer can optionally be made of metal to provide field shielding and/or electrical connection for a relatively small electronic filter within for attenuation of conducted electrical noise.
Figure 5:
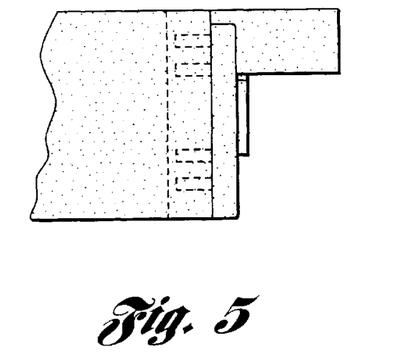
FIG. 5 is a side elevational view, partially broken away, of a small motor terminal end cap incorporating a revised retainer which grips the motor case on its inside. This retainer can optionally be made of metal to provide field shielding and/or electrical connection for a relatively small electronic filter within for attenuation of conducted electrical noise.
Figure 6:
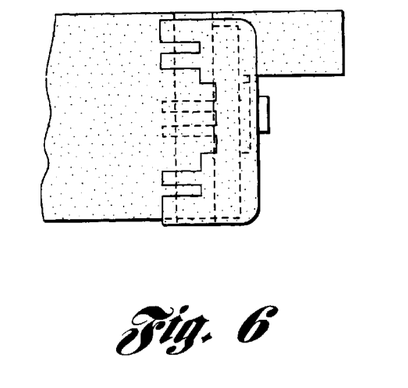
FIG. 6 is a side elevational view, partially broken away, of a small motor terminal end cap incorporating a revised retainer which grips the motor case both on its outside and inside. This retainer can optionally be made of metal to provide field shielding and/or electrical connection for a relatively small electronic filter within for attenuation of conducted electrical noise.

FIG. 3 shows a cutaway partial radial view of a typical small motor terminal end incorporating a connector.

SUMMARY OF THE INVENTION

An object of the present invention is to provide an end cap assembly for attenuating electrical noise and/or shielding radiated fields of an electrical motor wherein the end cap assembly forms part of the original equipment of the motor.

Another object of the present invention is to provide an end cap assembly for attenuating electrical noise in an electrical motor in a reliable fashion wherein the noise is controlled both where generated and where received.

Another object of the present invention is to provide an end cap assembly including a conductive panel having conductive members which interconnect discrete electrical components of an attenuating circuit which, in turn, attenuates electrical noise such as RFI noise both where generated and where received.

Yet still another object of the present invention is to provide an end cap assembly including a conductive panel having conductive members which interconnect discrete electrical components of an attenuating circuit, wherein the conductive panel not only attenuates electrical noise but also functions as a radiated field transmission shield.

In carrying out the above objects and other objects of the present invention, an end cap assembly for attenuating electrical noise of an electrical motor is provided. The motor has a shaft and a housing case. The end cap assembly includes a conductive panel having inner and outer surfaces includes interconnecting conductive members. The assembly also includes an attenuating circuit including a plurality of discrete electrical components supported at the inner surface of the conductive panel and electrically connected by the conductive members. The end cap assembly further includes terminals connected to and extending away from the outer surface of the conductive panel to facilitate connection of the end cap assembly in an electrical system. The assembly still further includes an electrical insulating end cap housing for housing the conductive panel and the plurality of discrete electrical components. The conductive panel and the plurality of discrete electrical components attenuate conductive electrical noise and wherein the conductive panel functions as a radiated field transmission shield.

Preferably, the attenuating circuit is a filter network array having both electrical and mechanical symmetry.

Also, preferably, the end cap assembly includes a retainer connected to and extending from the lower surface of the conductive panel for connecting the assembly to the housing case both mechanically and electrically such that the retainer is an electrical node of the attenuating circuit.

Also, preferably, the retainer includes a plurality of attachment members for gripping the housing case at a plurality of attachment locations.

Preferably, the end cap housing includes an insulating panel formed on the outer surface of the conductive panel such that the terminals extend through the insulating panel.

Further in carrying out the above objects and other objects of the present invention, an electrical motor having conducted electrical noise and radiated field transmissions is provided. The electrical motor includes a housing case, a device having a shaft disposed within the housing case for converting electrical energy into rotary motion of the shaft and an end cap assembly attached on or in the housing case as original equipment of the motor. The end cap assembly includes a conductive panel having interconnecting conductive members and an attenuating circuit having a plurality of discrete electrical components supported at an inner surface of the conductive panel and electrically interconnected by the conductive members. The conductive panel and the attenuating circuit attenuate the conducted electrical noise and the conductive panel functions as a radiated field transmission shield.

The end cap assembly is engineered to be electrically and/or physically attached to any of the following motor locations such as: case outside, case inside, case end, motor bearing, motor brush subassembly, and/or motor winding terminations.

The end cap assembly includes an attenuating electronic filter circuit to attenuate conducted transmissions and/or a shield to attenuate at least one field mode of energy transmission. An attenuating filter comprises at least one discrete electronic component cooperating with such electrically conductive circuit member components as copper, steel, phosphorus bronze, tin, solder, and silver. Electrical and mechanical connections of the electrical components can be made by such means as soldering, resistance welding, ultrasonic welding, brazing, crimping, swaging, wire wrapping, and mechanical compression forming. The interconnecting conductive members can be completely or selectively coated with materials which can facilitate manufacturing processes such as soldering, welding, brazing, or adhesion. Interconnecting conductive members for the circuit can be in such forms as sheet metal strip, lead frame, wire, wire frame, conductive plastic circuit board, metallized circuit board, and typical copper trace printed circuit (PC) board. Conductive members and electrical component(s) of the filter network array can optionally be held captive and contained in relative proximity by various known dielectric materials as fiber reinforced plastic (FRP), thermoplastic polymers, thermoset polymers, ceramic, glass, encapsulant, and adhesive by such methods as overmolding, insert molding, press fit insertion, and encapsulation.

Methods by which the end cap assembly can be attached into and/or onto the motor case axial end include interference press fit, cold staking, hot staking, crimping, riveting, orbital riveting, swaging, over molding, ultrasonic welding, vibration welding, brazing, soldering, encapsulation, adhesive, mechanical bend tab(s), spring clip(s), and threaded fastener.

Although the filter network array of the preferred embodiment is mechanically and electrically symmetrical, neither mechanical nor electrical symmetry is required, but is chosen as an engineering design choice alternative configuration to meet application requirements. The symmetrical electrical and mechanical electrical filter network array provides a balanced circuit impedance on both conductors of the power supply to the motor relative to the motor case which is used as a common node in the filter circuit.

Passive bidirectional field shielding can be provided by ferromagnetic and/or conductive material as the specific application requires. The motor end cap assembly can provide bidirectional shielding of fields by such integral conductive metallic material means as vapor metallization deposition onto at least one surface, metal impregnation within the encapsulant or plastic, inclusion of at least one stamped metal shield, at least one metallization layer of a circuit board, painting with metallic paint, and coverage by a generally electrically conductive member. Shielding material, as an electrical node, can be electrically floating, connected to motor case, connected to power supply, or connected to be common with any other available circuit node. In general, shielding is related to geometry and is improved with the area of coverage and conductivity of the shield material. In the ideal case, complete encapsulation of a circuit by a sphere of highly conductive material provides excellent shielding but is impractical to implement because of the necessity to transmit electrical and/or mechanical power, signals, and energy. By the passage of electrical conductors and/or mechanisms through a shield, a capacitive coupling and/or an antenna affect can be produced. Depending on the frequency of interest, even these passages need to be engineered to control types of electrical-related field transmission noise.

In this application, "discrete" means complete and self contained such that the use of the wording "discrete components" is construed to include single electrical components and also combinations of electrical elements into one device, for example as a combination of two inductors and a capacitor into a "T" filter having three electrical lead terminations.

The end cap assembly is an original equipment component engineered for incorporation within a motor end cap to attenuate conducted and/or radiated electrical noise. The assembly attenuates electrical noise and can incorporate:

A number=N, N=0, 1, 2, . . . , of discrete electrical component(s);

At least one layer of conductive strips in the form of a lead frame as a component of a conducted transmission filter and/or a radiated field transmission shield;

At least one layer of conductive strips in the form of a lead frame and insert molded within a polymeric plastic dielectric material as a component of a conducted transmission filter and/or a radiated field transmission shield;

Conductive strips in the form of a wire frame as a component of a conducted transmission filter and/or a radiated field transmission shield;

Conductive strips in the form of a printed circuit board;

Conductive materials which function to attenuate field modes of transmission (M-field, E-field, EM-field);

A printed circuit board in the form of electrically conductive films overlayed on a dielectric ceramic coating over a steel substrate; and A printed circuit board in the form of electrically conductive plastic inlays within a non-conductive plastic substrate.

The above objects and other objects, features and advantages of the present invention are readily apparent from the following detailed description of the best mode for carrying out the invention when taken in connection with the accompanying drawings.

BEST MODE FOR CARRYING OUT THE INVENTION

Figure 17:
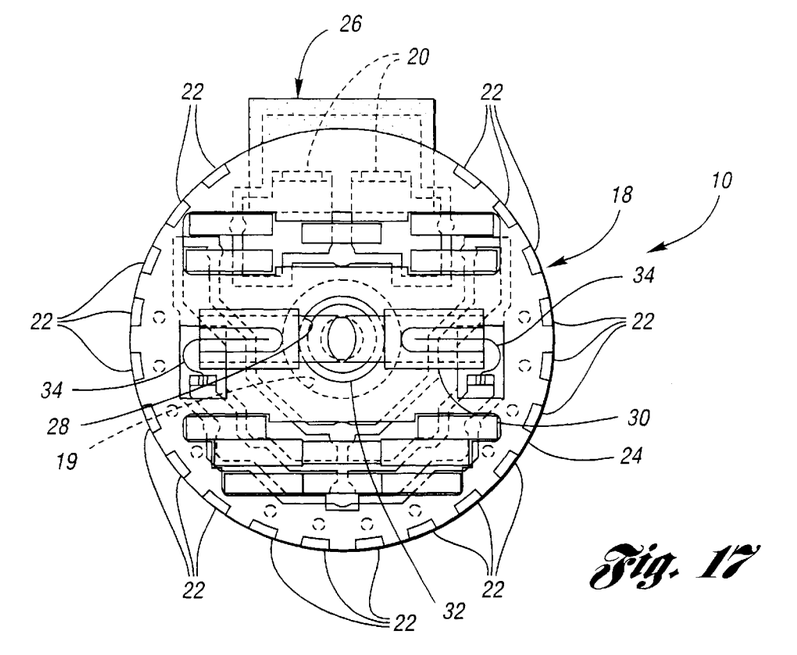
FIG. 17 is a bottom plan view of the lead frame of FIG. 16 including a commutator brush assembly.
Figure 18:
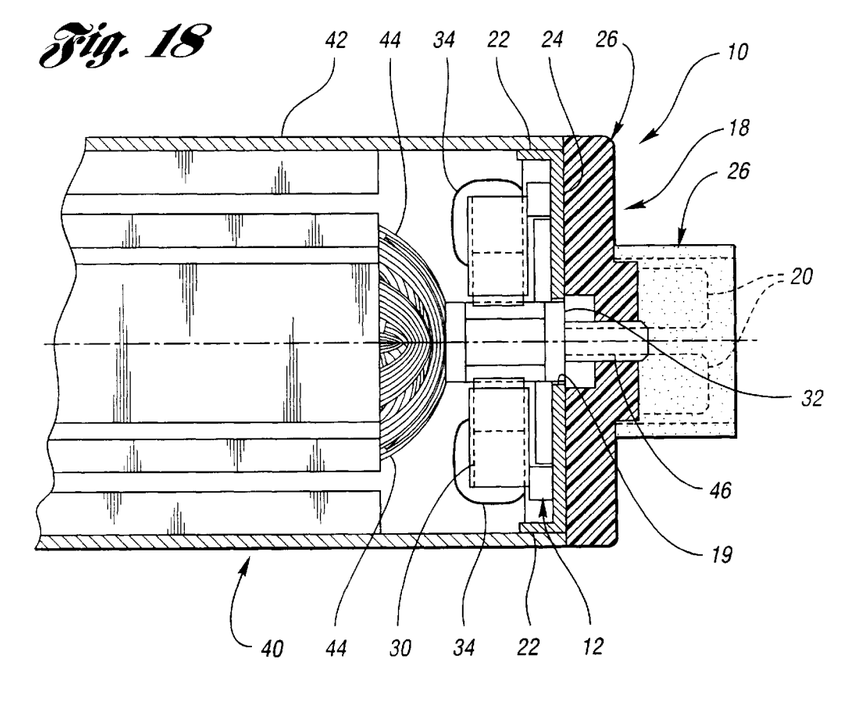
FIG. 18 is a side elevational view, partially broken away and in cross-section, of the lead frame of FIG. 17 with the rest of an electrical motor construct ed in accordance with the p resent invention.

The end cap assembly of the invention, generally indicated at 10 in FIGS. 17 and 18, is utilized as original equipment to replace existing end caps of motors to incorporate the principal function of attenuation of conducted and/or field radiated transients. This configuration has numerous advantages relative to the configuration of the above-noted application wherein the in-line module is a mechanical add on device having multiple mechanical and electrical attachments to a motor case and a multiplicity of electrical connections for insertion between motor terminals and a connector plug. These comparative system advantages of the present invention relative to the invention of the above-noted application are listed as follows:

1. Smaller size;
2. Less mass;
3. Fewer components—elimination of the redundant sets of electrical terminals;
4. Reduced component size—attenuation closer to the source of noise is more effective therefore fewer and/or smaller electrical components and shielding materials;
5. Location of the in-line module within the metallic motor housing or case gives inherent shielding to field modes of noise transmission in the radial direction with minimal shielding material necessary to attenuate only the axial direction;
6. Improved filter transfer function—shorter lead lengths of the filter circuit network array result in reduced emissivity and susceptibility as an antenna;

7. Conductive member strips of lead frame components can be made wide and strong enough to be self supporting as well as to cover much of the axial area of the motor case to provide bidirectional shielding of field transmission modes;

8. Reduced voltage drop, power loss, and undesired heating caused by ohmic contact of terminal connections;

9. Improved reliability due to fewer terminal connections; and

10. Lower total cost.

An alternative preferred embodiment of the present invention incorporates a printed circuit board incorporating electrically conductive strips as traces on a ceramic coating over a single or multiple layer steel substrate. The steel substrate gives structural support and also functions in a capacity to shield against low frequency magnetic fields and high frequency fields of all types in the axial direction of the motor housing. This steel substrate can also be an electrical node of the filter network array, common with the motor housing with at least one point and preferably with a multiplicity of points around the motor housing. Additional supplementary conductive shielding may be unnecessary, depending on the specific application requirements.

Figure 10:
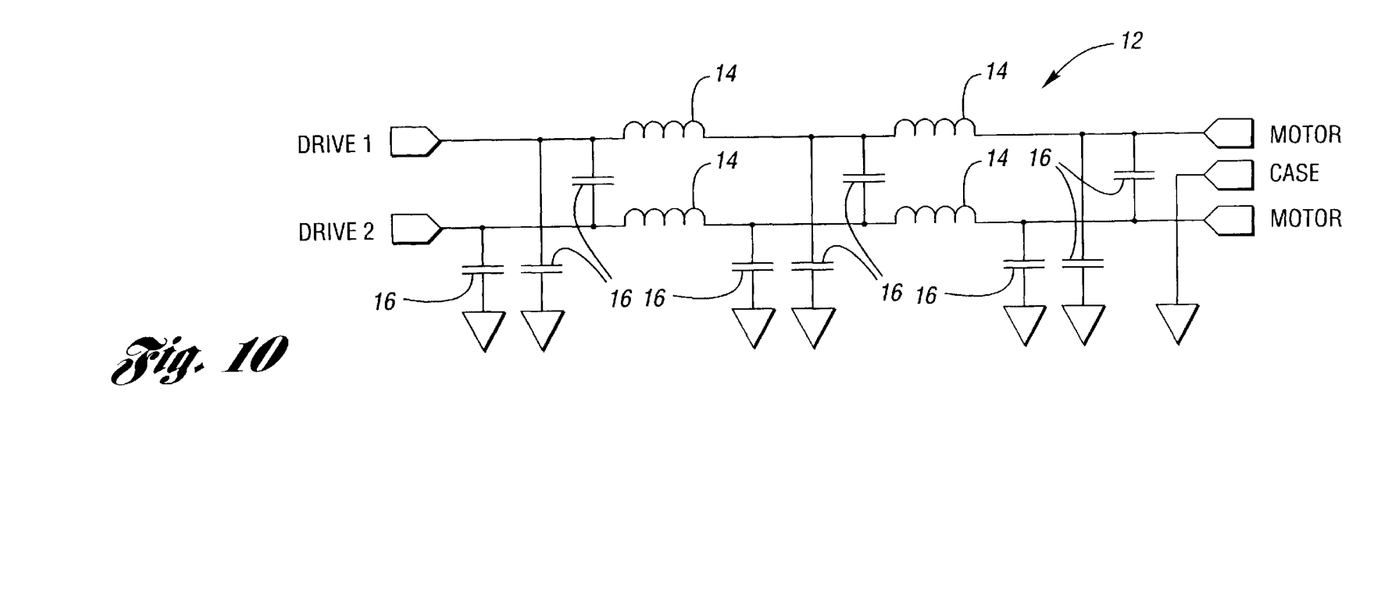
FIG. 10 is a schematic diagram of a filter network array constructed in accordance with the present invention.

FIG. 10 is a symmetrical multiple schematic typical of the general type of multiple component conducted filter network array, generally indicated at 12, which can effectively attenuate high frequency conducted electrical noise via reactive components such as inductors 14 and capacitors 16. In some applications, resistive components can also be utilized to provide the functionality of a low pass filter having high frequency attenuation.

Figure 11:
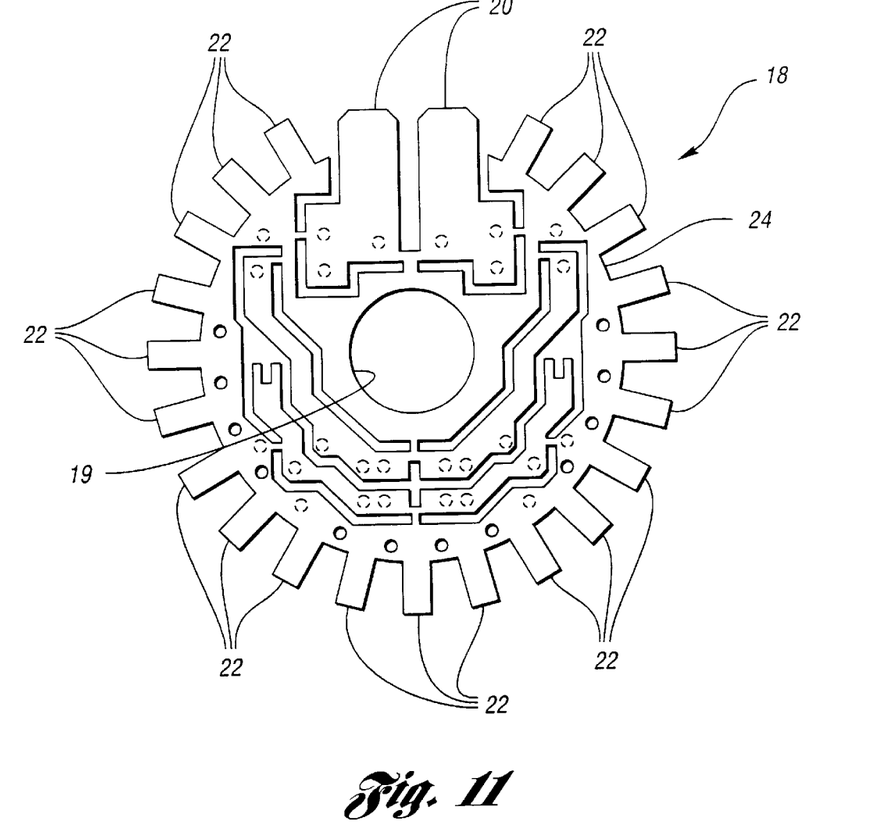
FIG. 11 is a top plan view of a single piece lead frame of the present invention.

FIG. 11 shows an example of an axial view of a flat lead frame as stamped, generally indicated at 18, for use with the circuit or array 12 represented by FIG. 10. The lead frame 18 can be sheared by metal stamping tools or cut by such means as a laser, high speed fluid abrasive slurry, or high temperature cutting micro torch. A central aperture 19 is formed through the lead frame 18 to accommodate a rotor shaft and/or bearing.

Typical materials for the lead frame 18 include alloys of copper or steel which are optionally plated to provide solderability, weldability, and/or corrosion retardation. The lead frame 18 is a single piece that can be further processed to provide structure, electric circuit conduction, and metallic shielding functions.

Figure 12:
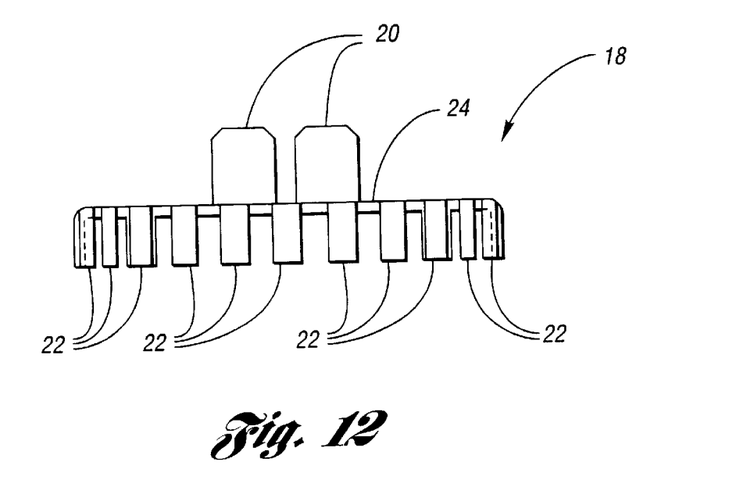
FIG. 12 is a side elevational view of the lead frame of FIG. 11 after bending it to form blade terminals and attachment members.

FIG. 12 shows a radial view of the lead frame 18 of FIG. 11 as bent to shape male blade terminals 20 and attachment members 22 of a retainer which are still connected to and extend away from an apertured panel 24 prior to the subsequent step of over molding for the motor end cap application.

Figure 13:
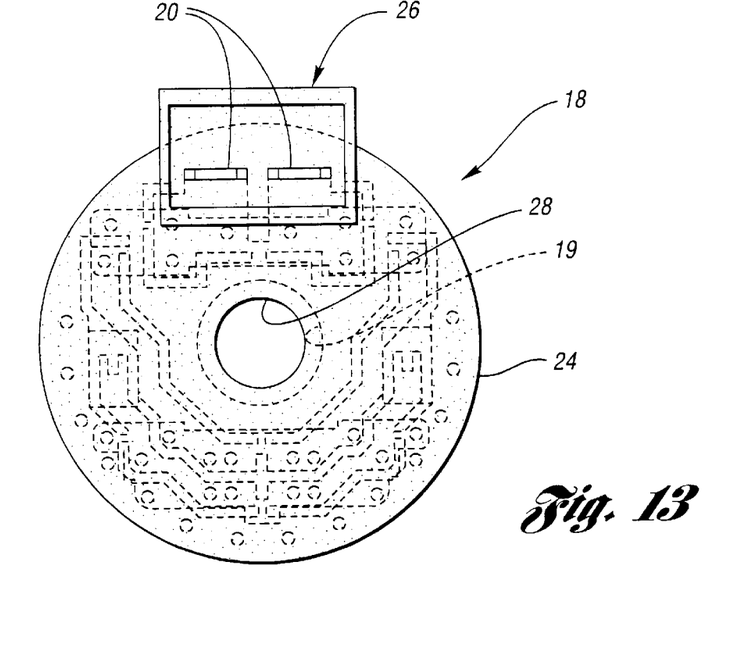
FIG. 13 is a top plan view of the lead frame of FIG. 12 after over molding.

FIG. 13 shows an outer axial view of the lead frame 18 of FIG. 12, including the integral termination connectors or terminals 20, after over molding with a plastic to form an end cap housing, generally indicated at 26, having a central hole 28 formed therethrough to accommodate a rotor shaft and/or bearing.

Figure 14:
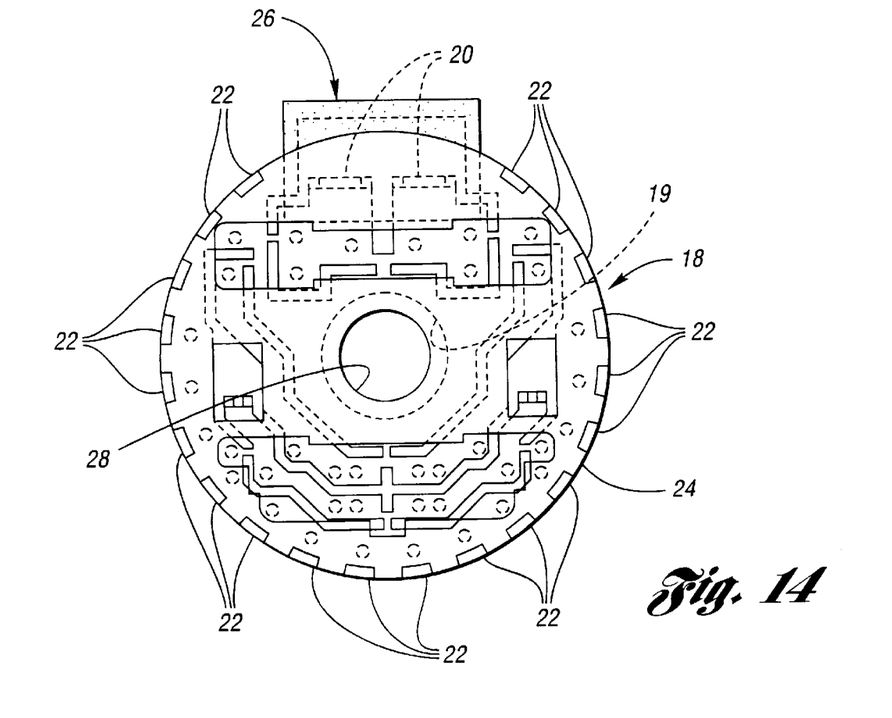
FIG. 14 is a bottom plan view of the lead frame of FIG. 12 after over molding.

FIG. 14 shows the inner axial view of the lead frame 18 of FIG. 13 after over molding. The areas where the lead frame 18 are left exposed are for cutting out of web area that electrically short out the filter circuit 12, for electrical attachment components of the filter circuit 12, and for electrical termination of motor commutator brush assemblies 30 in FIGS. 17 and 18.

Figure 15:
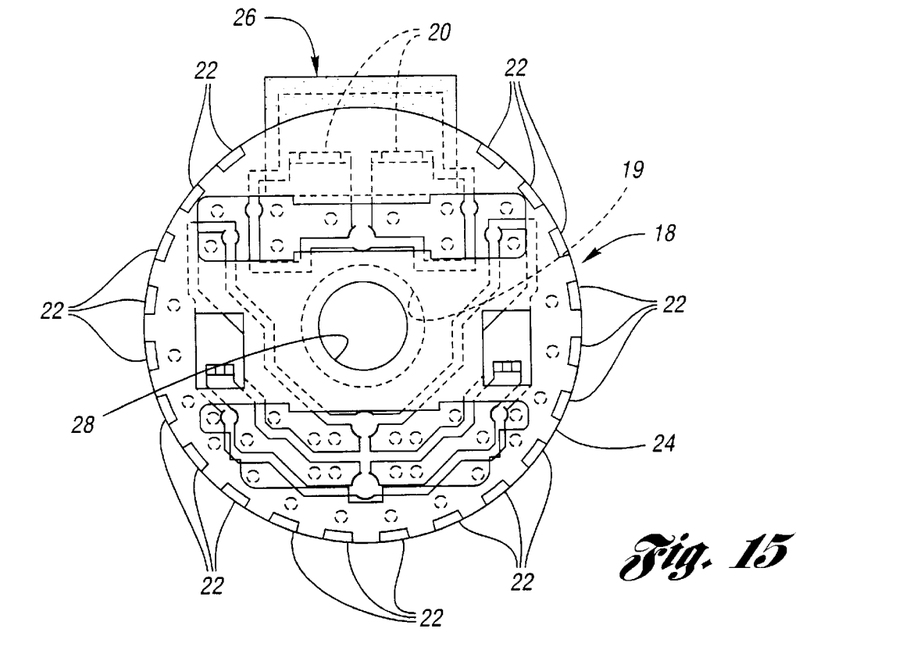
FIG. 15 is a bottom plan view of the lead frame of FIG. 14 after cutting away lead frame webs.

FIG. 15 shows the inner axial view of the overmolded subassembly of FIG. 14 after cutting out structural shorting conductor webs which are no longer needed. The lead frame of 18 now resembles a printed circuit board.

Figure 16:
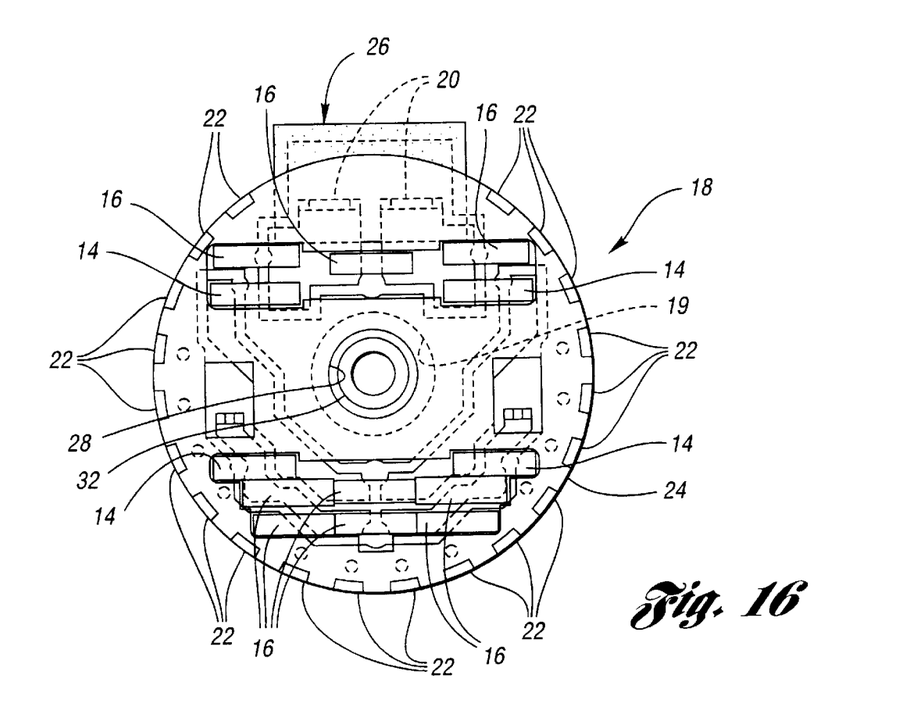
FIG. 16 is a bottom plan view of the lead frame of FIG. 15 including a bearing assembly and outlines of the electrical components of FIG. 10.

FIG. 16 shows the inner axial view of the cutout subassembly of FIG. 15 with pictorial outline representations of placements of a bearing assembly 32 within the hole 28 and electrical components 14 and 16 of the schematic of FIG. 10. These components 14 and 16 can be electrically and mechanically attached to the conductive members which form the panel 24 by such means as soldering, welding, or crimping by lead frame details which are not shown.

FIG. 17 shows the inner axial view of the motor end cap assembly 10 of FIG. 16 with subsequent addition of the motor commutator brush assembly 30 with flexible leads 32 also connected to the electrical terminals 20 of the lead frame 18.

Figure 7:
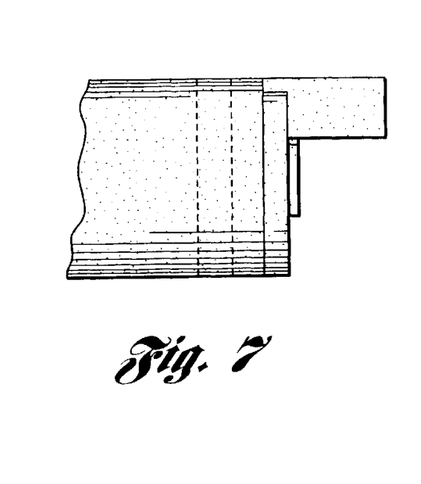
FIG. 7 is a side elevational view, partially broken away, of a small motor terminal end in which additional interior space is provided within the case for an electronic filter circuit by extending the axial lengths of both the motor case and the rotor shaft. At least one layer of integral metal shielding is an application option of the motor end cap.
Figure 8:
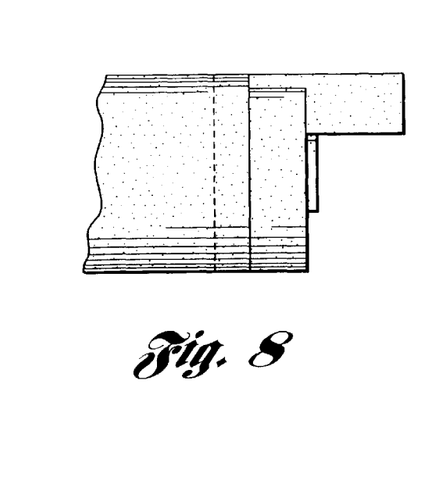
FIG. 8 is a side elevational view, partially broken away, of a small motor terminal end in which case additional interior space is provided for an electronic filter circuit by extending the length of the rotor shaft and increasing the axial length of the end cap. At least one layer of integral metal shielding is an application option of the motor end cap. Typical features common to small motors similar to FIGS. 1–8 include integral connector, dielectric insulator component materials to contain electrical conducting members of the terminals, electrical conductor materials, related motor brush component assemblies, one thrust bushing, and one mechanical rotary bearing.
Figure 9:
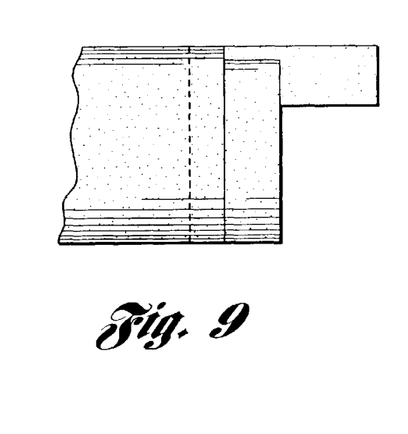
FIG. 9 is a side elevational view, partially broken away, of a small motor terminal end in which additional interior space is provided for an electronic filter circuit by increasing the axial length of the end cap. At least one layer of integral metal shielding is an application option of the motor end cap.

FIG. 18 shows a partial radial cutaway view of a typical motor, generally indicated at 40, in final assembly including the end cap assembly 10 of FIG. 17. This is a modification of FIG. 7 with the inclusion of an ILM electronic conducted noise filter using conductive members in the form of the lead frame 18 which serves also as common electrical node with a case 42 of the motor 40 and as a radiated emission shield. The motor 40 also includes coils 44 and a shaft 46 which is rotatably supported by the bearing assembly 32 to rotate within the hole 28 and the aperture 19.

The preferred embodiment of the ILM noise filter module or assembly 10 has the dielectric insulating component or housing 26 containing the electric noise attenuating circuit 12.

Electrically conducted noise can be attenuated via a filter circuit on a printed circuit board, similar to that originally disclosed. Printed circuit conductors can also act in a radiated transmission shield capacity, especially when the PC board is practically close to being completely covered with a highly conductive material. Additional shielding capability can be achieved by addition of at least one more conductor layer on the PC board. An additional conductor layer of the PC board can also functionally serve as one electrode of at least one filter capacitor, the capacitance being proportionate to the electrode area and inverse to the dielectric spacing between capacitor electrodes. The additional conductor can be electrically connected to the motor case 42 in at least one location and preferably in numerous locations around the motor case 42 circumference so as to create the effect of a Faraday shield to shield motor-produced radiated transmissions within the motor case 42. By appropriate circuit design and layout it is possible to some extent to create a partial Faraday shield with only a single layer PC board to serve in the dual capacity as both a conducted transmission attenuation circuit and as a radiation shield.

It may not always be practical or feasible to electrically connect the PC board conductors to the motor case 42 in a multiplicity of locations, in which case by keeping the conductor spacing relatively close to the motor case 42, the effective aperture for passing radiated transmission is kept physically small such that primarily only higher frequencies of field mode emissions are allowed to pass. The preferred apparatus will keep the physical sizes and shapes of the dielectric space (including air) within the effective shield provided by the interconnecting and/or noninterconnecting conductive members of the end cap relatively small such that the potential resonant field-mode frequencies are not suitably wavelength matched to transmit energy to the outside via apertures of said conductive members. Preferably, the high frequencies of any such resonance will be higher than the maximum frequencies disallowed per the application specification.

Electrical connections and conductors or terminals 20 at the connector end of the motor 40 can be but are typically not openly exposed so as to protect against inadvertent short circuits. Implementation of the ILM as a bare PC board alone is generally unacceptable for many applications without some means of dielectric protection of the circuit conductors.

One preferred means of electrically and mechanically protecting a PC board is by design of an insulating cover that attaches to the PC board by such means as snap fit, mechanical clips, threaded fasteners, and adhesive. Alternatively, the PC board can be protected by overmolding the PC board with a polymeric dielectric material prior to its assembly with the motor case subassembly.

Another preferred embodiment of a circuit including electrical components 14 and 16 and conductors is by utilization of a wire frame assembly. In one form of a wire frame assembly electrical components 14 and 16 are electrically connected with or without appropriate protective insulating spacers to relatively heavy gauge metal frame subassembly as one piece. Specific areas of the molded assembly are cut open either before or after overmolding or encapsulation to remove wire frame areas that electrically shorted out the lead frame but also maintained structural integrity of the lead frame for purposes of handling and/or overmolding. By design of the lead frame to cover much of the axial and by electrical connections around the motor case, the wire frame can provide somewhat of a Faraday cage effect to reduce transmission of radiated fields. By reduction of the effective aperture size for field radiation, only primarily higher frequencies are allowed to be emitted.

An optional preferred embodiment of the ILM noise filter is to have a metallic outer cover both mechanically and electrically attached to the metallic motor case 42 similar to FIGS. 3–8.

Another optional and preferred embodiment of the ILM noise filter is to use a partially conductive filler material, such as ferrite or metal powder, in the dielectric molded end cap body such that it provides properties of attenuation of radiated field emissions.

In general, the motor end cap may include:
1. Interconnecting and/or non-interconnecting conductive members of high electrical conductivity and significant end cap coverage so as to provide shielding to field modes of electrical noise propagation;
2. At least one electric filter component to filter conduction modes of electrical noise propagation;
3. Significant coverage and filling with a ferromagnetic material of low electrical conductivity to shield by passive absorption of field modes of electrical noise propagation; and
4. Combinations of 1 and/or 2 and/or 3 above.

It should be apparent to one knowledgeable in the art that other variations of this invention can perform similar functions. Each development is generally applied according to the requirements specified for the application. The quantity of electronic components 14 and 16 required for conducted noise attenuation, the commutation brush assembly 30, and the bearing assembly 32 might be unable to be packaged within the physical outlines of an existing motor end cap. In cases where additional packaging volume is required, the anticipated solutions include length extension of the motor case 42 and rotor shaft 46, length extension of the motor end cap dimension and rotor shaft 46, or extension of only the motor end cap dimension.

While the best mode for carrying out the invention has been described in detail, those familiar with the art to which this invention relates will recognize various alternative designs and embodiments for practicing the invention as defined by the following claims.

What is claimed is:

1. An end cap assembly for attenuating electrical noise of an electrical motor having a shaft and a housing case, the assembly comprising:
   a conductive panel having inner and outer surfaces and including interconnecting and/or non-interconnecting conductive members;
   an attenuating circuit including a number of discrete electrical components supported at the inner surface of the conductive panel and electrically connected by the conductive members;
   terminals connected to and extending away from the outer surface of the conductive panel to facilitate connection of the end cap assembly in an electrical system;
   an electrically insulating end cap housing for housing the conductive panel and the plurality of discrete electrical components, wherein the conductive panel and the plurality of discrete electrical components attenuate conductive electrical noise and wherein the conductive panel functions as a radiated field transmission shield; and
   a bearing assembly supported by the conductive panel for, in turn, rotatably supporting the shaft of the motor within the assembly.

2. An end cap assembly for attenuating electrical noise of an electrical motor having a shaft and a housing case, the assembly comprising:
   a conductive panel having inner and outer surfaces and including interconnecting and/or non-interconnecting conductive members;
   an attenuating circuit including a number of discrete, reactive electrical components supported at the inner surface of the conductive panel and electrically connected by the conductive members;
   terminals connected to and extending away from the outer surface of the conductive panel to facilitate connection of the end cap assembly in an electrical system;
   an electrically insulating end cap housing for housing the conductive panel and the plurality of discrete electrical components, wherein the conductive panel and the plurality of discrete electrical components attenuate conductive electrical noise and wherein the conductive panel functions as a radiated field transmission shield.

3. An electrical motor having attenuated conducted electrical noise and radiated field transmissions, the electrical motor comprising:
   a housing case;
   a device including a shaft disposed within the housing case for converting electrical energy into rotary motion of the shaft;
   an end cap assembly attached on or in the housing case as original equipment of the motor, the end cap assembly including a conductive panel having interconnecting conductive members and an attenuating circuit having a number of discrete electrical components supported at an inner surface of the conductive panel and electrically interconnected by the conductive members, wherein the conductive panel and the attenuating circuit attenuate the conducted electrical noise and wherein the conductive panel functions as a radiated field transmission shield; and
   a retainer connected to and extending from the lower surface of the conductive panel for connecting the assembly to the housing case both mechanically and electrically wherein the retainer is an electrical node of the attenuating circuit.

4. An electrical motor having attenuated conducted electrical noise and radiated field transmissions, the electrical motor comprising:

a housing case;

a device including a shaft disposed within the housing case for converting electrical energy into rotary motion of the shaft;

an end cap assembly attached on or in the housing case as original equipment of the motor, the end cap assembly including a conductive panel having interconnecting conductive members and an attenuating circuit having a number of discrete reactive electrical components supported at an inner surface of the conductive panel and electrically interconnected by the conductive members, wherein the conductive panel and the attenuating circuit attenuate the conducted electrical noise and wherein the conductive panel functions as a radiated field transmission shield.

5. An electrical motor having attenuated conducted electrical noise and radiated field transmissions, the electrical motor comprising:

a housing case;

a device including a shaft disposed within the housing case for converting electrical energy into rotary motion of the shaft; and an end cap assembly attached on or in the housing case as original equipment of the motor, the end cap assembly including a conductive panel having interconnecting conductive members and an attenuating circuit having a number of discrete electrical components supported at an inner surface of the conductive panel and electrically interconnected by the conductive members, wherein the conductive panel and the attenuating circuit attenuate the conducted electrical noise and wherein the conductive panel functions as a radiated field transmission shield, wherein the end cap assembly includes a bearing assembly for rotatably supporting the shaft.

6. An end cap assembly for attenuating electrical noise of an electrical motor having a shaft and a housing case, the assembly comprising:

a conductive panel having inner and outer surfaces and including interconnecting and/or non-interconnecting conductive members;

an attenuating circuit including a number of discrete electrical components supported at the inner surface of the conductive panel and electrically connected by the conductive members;

terminals connected to and extending away from the outer surface of the conductive panel to facilitate connection of the end cap assembly in an electrical system;

an electrically insulating end cap housing for housing the conductive panel and the plurality of discrete electrical components, wherein the conductive panel and the plurality of discrete electrical components attenuate conductive electrical noise and wherein the conductive panel functions as a radiated field transmission shield; and a retainer connected to and extending from the lower surface of the conductive panel for connecting the assembly to the housing case both mechanically and electrically wherein the retainer is an electrical node of the attenuating circuit.

7. The assembly as claimed in claim 6 wherein the retainer includes a plurality of attachment members for gripping the housing case at a number of attachment locations.

8. The assembly as claimed in claim 6 wherein the retainer secures the assembly at an inner surface of the housing case.

9. The assembly as claimed in claim 6 wherein the retainer secures the assembly at an outer surface of the housing case.

10. The assembly as claimed in claim 6 wherein the retainer secures the assembly at inner and outer surfaces of the housing case.

* * * * *